(12) United States Patent
Nishimura et al.

(10) Patent No.: US 8,383,521 B2
(45) Date of Patent: Feb. 26, 2013

(54) SUBSTRATE PROCESSING METHOD (75) Inventors: Eiichi Nishimura, Nirasaki (JP); Masato Kushibiki, Nirasaki (JP); Fumiko Yamashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 352 days.

(21) Appl. No.: 12/721,006

(22) Filed: Mar. 10, 2010

(65) Prior Publication Data
US 2010/0233883 A1 Sep. 16, 2010

Related U.S. Application Data (60) Provisional application No. 61/176,505, filed on May 8, 2009.

(30) Foreign Application Priority Data

Mar. 10, 2009 (JP) ................................. 2009-056336

(51) Int. Cl.
*H01L 21/302* (2006.01)
(52) U.S. Cl. ........ 438/723; 438/124; 438/694; 438/735; 428/124; 428/172; 428/209; 428/213
(58) Field of Classification Search .................. 438/702, 438/743, 700, 301, 689, 696, 690, 231, 592, 438/717, 692; 257/734, 20; 216/41, 40; 430/312, 313, 314; 361/321.4
See application file for complete search history.

(56) References Cited

U.S. PATENT DOCUMENTS

| 6,632,741 | B1 * | 10/2003 | Clevenger et al. ............ 438/689 |
| 2006/0273456 | A1 * | 12/2006 | Sant et al. ..................... 257/734 |
| 2008/0193882 | A1 | 8/2008 | Endo et al. | |

FOREIGN PATENT DOCUMENTS

JP 2008-258562 10/2008

* cited by examiner

*Primary Examiner* — Duy Deo
*Assistant Examiner* — Erin Bergner
(74) *Attorney, Agent, or Firm* — Rothwell, Figg, Ernst & Manbeck, P.C.

(57) ABSTRACT

A substrate processing method processes a substrate including a processing target film, an organic film provided on the processing target film and having a plurality of line-shaped portions having fine width, and a hard film covering the line-shaped portions and the processing target film exposed between the line-shaped portions. The method includes a first etching step of etching a part of the hard film to expose the organic film and portions of the processing target film between the line-shaped portions; an ashing step of selectively removing the exposed organic film; and a second etching step of etching a part of the remaining hard film.

8 Claims, 10 Drawing Sheets

SUBSTRATE PROCESSING METHOD

CROSS-REFERENCE TO RELATED APPLICATIONS

This application claims priority to Japanese Patent Application No. 2009-056336 filed on Mar. 10, 2009, the entire contents of which are incorporated herein by reference.

FIELD OF THE INVENTION

The present invention relates to a substrate processing method; and, more particularly, to a substrate processing method for forming a plurality of line-shaped portions with fine pitches on a mask film.

BACKGROUND OF THE INVENTION

Along with the trend toward finer semiconductor devices, it will be required in the near future to form trenches or the like with fine pitches of, e.g., about 30 nm, on an insulating film or the like in a semiconductor device manufacturing process. Thus, a plurality of line-shaped portions (lines) needs to be formed with fine pitches on the mask film.

In a conventional lithography using a laser beam or the like, a minimum width that can be developed is about 50 nm. Therefore, it is difficult to form a plurality of lines with pitches smaller than about 50 nm on a photoresist film serving as a mask film.

To that end, a double patterning process has been recently developed as a technique for forming a plurality of lines with fine pitches on a photoresist film. A representative example of the double patterning process includes: forming a base film, an interlayer film and a first resist film on a substrate; forming a first resist pattern by performing first exposure; forming a first interlayer pattern by transferring the first resist pattern onto the interlayer film; forming a second resist film on the first interlayer pattern; forming a second resist pattern by performing second exposure; and forming a second interlayer pattern having a plurality of lines formed with fine pitches by transferring the second resist pattern onto the interlayer film (see, e.g., Japanese Patent Application Publication No. 2008-258562 and corresponding US patent Application Publication No. 2008-193382 A1).

Figure 7A:
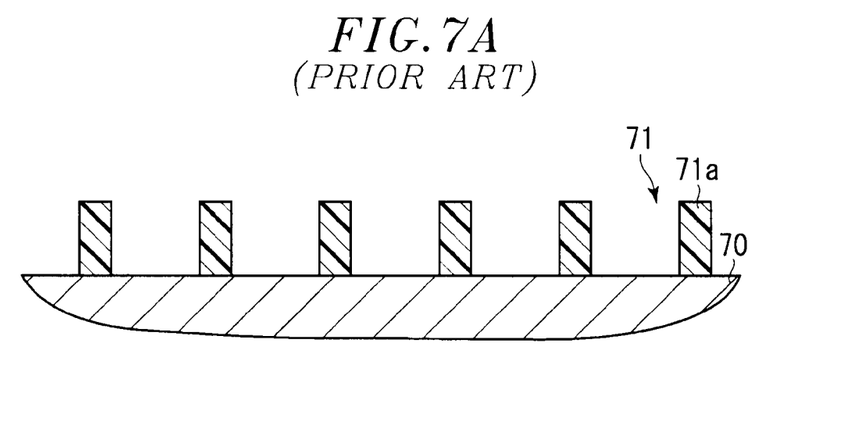
FIGS. 7A to 7E show a double patterning process in a conventional hard mask film.
Figure 7B:
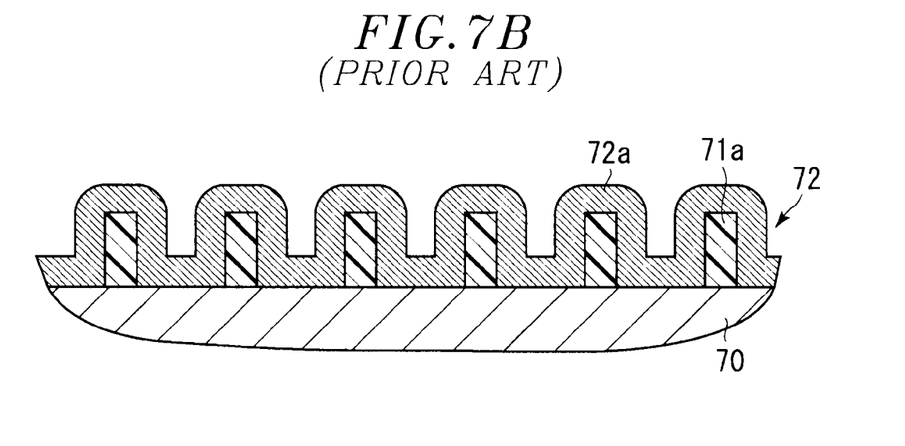
Figure 7C:
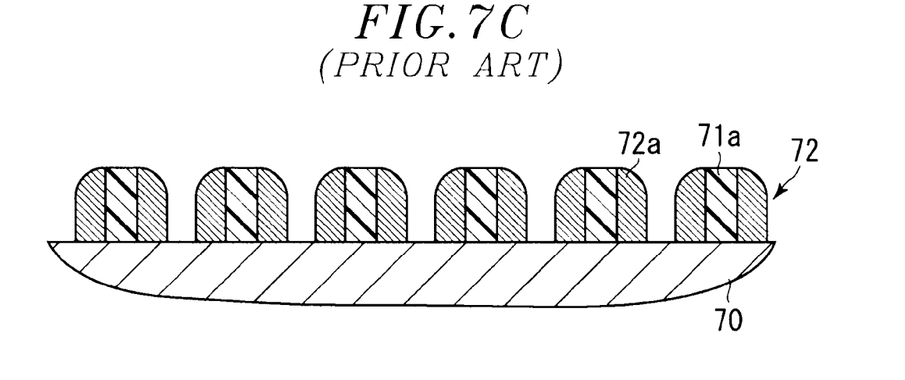

As for a mask film, a hard mask film made of a silicon-based material such as silicon carbide (SiC) or the like may be used instead of a photoresist film. In the representative example of the double patterning process using the hard mask film as shown in FIGS. 7A to 7E, an organic film 71 having a plurality of lines 71a formed on a processing target film 70 is etched such that a width of each of lines 71a is reduced to about 30 nm (FIG. 7A). Next, the lines 71a and the processing target film 70 are uniformly coated with a silicon oxide film 72 by CVD (Chemical Vapor Deposition) (FIG. 7B). By CVD, the lines 71a grow into thicker lines 72a. Then, the silicon oxide film 72 between the lines 72a and on the lines 72a is removed by anisotropic etching (FIG. 7C).

Figure 7D:
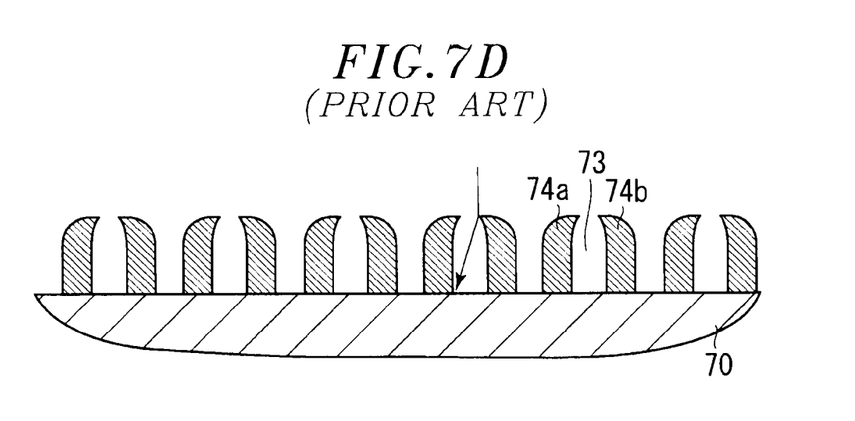

Thereafter, each of the lines 72a constitutes a pair of lines 74a and 74b by removing the exposed organic film 71 in the lines 72a by ashing (FIG. 7D). The pitch between the lines 74a and 74b of each pair is substantially equal to the width of each of the lines 71a, so that the pairs of the lines 74a and 74b can be used as a mask film having lines formed with pitches of about 30 nm.

Figure 7E:
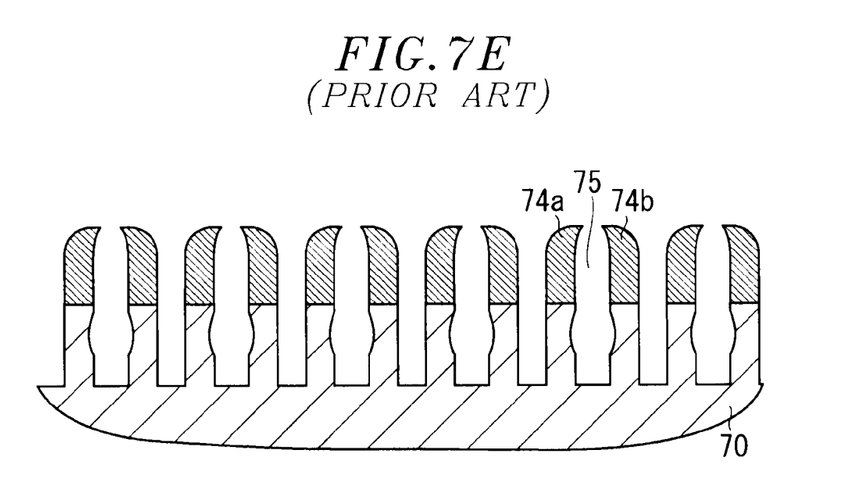

However, when the organic film 71 is removed, ions that are not perpendicularly incident toward the processing target film 70 are introduced into spaces 73 formed by removing the organic film 71 of the lines 72a, so that the spaces 73 are enlarged except for upper portions thereof. As a consequence, each pair of lines 74a and 74b forms a pair of asymmetric sidewalls having a crab claw shape (FIG. 7D). Specifically, an upper end portion of one line is bent toward the other line. Then, openings 75 are formed in the processing target film 70 by etching the processing target film 70 while using the each pair of lines 74a and 74b (formed of the silicon oxide film 72) as a mask. At this time, some of the ions entering the spaces 73 may be reflected in unexpected directions (indicated by an arrow in FIG. 7D) by collision with the bent end portions of the lines 74a and 74b, so that some of the ions may collide with the processing target film 70 in non-perpendicular directions. As a result, the cross sectional shape of the openings 75 does not make a regular rectangular shape, but a rectangular shape having a swollen middle portion (FIG. 7E).

SUMMARY OF THE INVENTION

In view of the above, the present invention provides a substrate processing method capable of forming an opening having a substantially straight sidewall in a processing target film.

In accordance with an embodiment of the present invention, there is provided a substrate processing method for processing a substrate including a processing target film, an organic film provided on the processing target film and having a plurality of line-shaped portions having fine width, and a hard film covering the line-shaped portions and the processing target film exposed between the line-shaped portions. The method includes a first etching step of etching a part of the hard film to expose the organic film and portions of the processing target film between the line-shaped portions; an ashing step of selectively removing the exposed organic film; and a second etching step of etching a part of the remaining hard film.

In accordance with another embodiment of the present invention, there is provided a substrate processing method for processing a substrate including a processing target film, a first hard film formed on the processing target film, an organic film provided on the first hard film and having a plurality of line-shaped portions having fine width, and a second hard film covering the line-shaped portions and the first hard film exposed between the line-shaped portions. The method includes a first etching step of etching a part of the second hard film to expose the organic film and portions of the first hard film between the line-shaped portions; an ashing step of selectively removing the exposed organic film; and a second etching step of etching a part of the remaining second hard film and the exposed portions of the first hard film.

BRIEF DESCRIPTION OF THE DRAWINGS

The objects and features of the present invention will become apparent from the following description of embodiments, given in conjunction with the accompanying drawings, in which:

FIGS. 4A and 4B are plan views showing changes in shapes of side portions of lines during the fine line forming process shown in FIGS. 3A to 3F, wherein FIG. 4A depicts the shapes of the side portions before performing the fine pitch line forming process shown in FIGS. 3A to 3F, and FIG. 4B depicts the shapes of the side portions after performing the fine pitch line forming process shown in FIG. 3A to 3F;

DETAILED DESCRIPTION OF THE EMBODIMENTS

The embodiments of the present invention will be described with reference to the accompanying drawings which form a part hereof.

First of all, a substrate processing method in accordance with a first embodiment of the present invention will be described.

Figure 1:
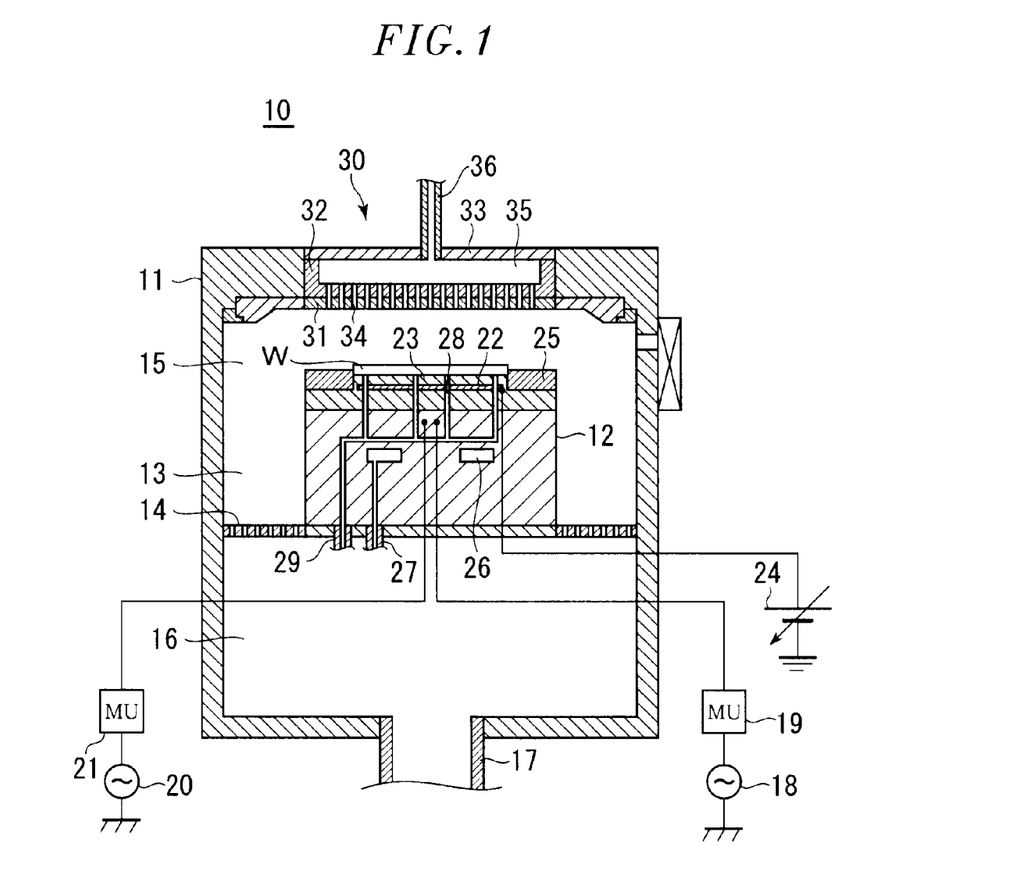
FIG. 1 is a cross sectional view schematically showing a configuration of a plasma processing apparatus for performing main steps of a fine pitch line forming process as a substrate processing method in accordance with a first embodiment of the present invention.

FIG. 1 is a cross sectional view schematically showing a configuration of a plasma processing apparatus for performing main steps of a fine pitch line forming process as the substrate processing method in accordance with the first embodiment of the present invention.

Referring to FIG. 1, a plasma processing apparatus 10 includes a chamber 11 for accommodating therein a wafer W for semiconductor devices having a diameter of, e.g., about 300 mm, and a cylindrical susceptor 12 (mounting table) for mounting thereon the wafer W disposed in the chamber 11. In the plasma processing apparatus 10, a side exhaust passageway 13 is formed by an inner sidewall of the chamber 11 and a side surface of the susceptor 12, the side exhaust passageway 13 serving as a flow path through which a gas above the susceptor 12 is exhausted to the outside of the chamber 11. A gas exhaust plate 14 is provided in the side exhaust passageway 13.

The gas exhaust plate 14 is a plate-shaped member having a plurality of through holes, and serves as a partition plate for partitioning the chamber 11 into an upper portion and a lower portion. A plasma is generated in the upper portion 15 (hereinafter, referred to as a "reaction chamber") of the chamber 11 partitioned by the gas exhaust plate 14. Further, the lower portion 16 (hereinafter, referred to as a "gas exhaust chamber (manifold)") of the chamber 11 is connected to a gas exhaust line 17 through which a gas in the chamber 11 is exhausted. The gas exhaust plate 14 captures or reflects the plasma generated in the reaction chamber 15 in order to prevent the leakage of the plasma into the manifold 16.

A TMP (Turbo Molecular Pump) and a DP (Dry Pump) (both not shown) are connected to the gas exhaust line 17, and reduce a pressure in the chamber 11 to a vacuum state. Specifically, the DP reduces the pressure in the chamber 11 from the atmospheric pressure to an intermediate vacuum state (e.g., about $1.3 \times 10$ Pa (0.1 Torr) or less), and the TMP operates with the DP to reduce the pressure in the chamber 11 from the intermediate vacuum state to a high vacuum state (e.g., about $1.3 \times 10^{-3}$ Pa ($1.0 \times 10^{-5}$ Torr) or less). Moreover, the pressure in the chamber 11 is controlled by an APC (Automatic Pressure Control) valve (not shown).

The susceptor 12 in the chamber 11 is connected to a first high frequency power supply 18 via a first matching unit (MU) 19 and also connected to a second high frequency power supply 20 via a second matching unit (MU) 21. Further, the first high frequency power supply 18 supplies to the susceptor 12 a high frequency power for ion attraction which has a relatively low frequency, e.g., about 2 MHz. Moreover, the second high frequency power supply 20 supplies to the susceptor 12 a high frequency power for plasma generation which has a relatively high frequency, e.g., about 100 MHz. Accordingly, the susceptor 12 serves as an electrode. Furthermore, the first and the second matching unit 19 and 21 reduce reflection of the high frequency powers from the susceptor 12 in order to maximize the supply efficiency of the high frequency powers to the susceptor 12.

An electrostatic chuck 23 having therein an electrostatic electrode plate 22 is disposed on the susceptor 12. The electrostatic chuck 23 has a shape in which an upper circular plate-shaped member is laminated on a lower circular plate-shaped member, wherein a diameter of the upper circular plate-shaped member is smaller than that of the lower circular plate-shaped member. Further, the upper and lower circular plate-shaped member of the electrostatic chuck 23 is made of ceramic.

The electrostatic electrode plate 22 is connected to a DC power supply 24. When a positive DC voltage is applied to the electrostatic electrode plate 22, a negative potential is generated on the surface (hereinafter, referred to as a "back surface") of the wafer W which faces the electrostatic chuck 23, thereby causing a potential difference between the electrostatic electrode plate 22 and the back surface of the wafer W. The wafer W is attracted to and held on the upper circular plate-shaped member of the electrostatic chuck 23 by a Coulomb force or a Johnson-Rahbeck force generated due to the potential difference.

In addition, an annular focus ring 25 is mounted on the electrostatic chuck 23 to surround the wafer W attracted to and held on the electrostatic chuck 23. The focus ring 25 is made of an electrically conductive material, e.g., a single crystalline silicon, which is the same as that of the wafer W. Since the focus ring 25 is made of an electrical conductor, the plasma distribution region extends to above the focus ring 25 as well as above the wafer W. Accordingly, the density of plasma at a peripheral portion of the wafer W can be maintained to be identical to that of plasma at a central portion of the wafer W. This ensures the uniformity of the plasma etching performed on the entire surface of the wafer W.

An annular coolant chamber 26 is provided inside the susceptor 12, extending, e.g., in a circumferential direction thereof. A low-temperature coolant, e.g., a cooling water or Galden (registered trademark), is supplied from a chiller unit (not shown) to the coolant chamber 26 via a coolant line 27 to be circulated. The susceptor 12 cooled by the low-temperature coolant cools the electrostatic chuck 23, the wafer W and the focus ring 25.

A plurality of heat transfer gas supply holes 28 opens at a portion (hereinafter, referred to as an "adsorption surface") of the upper circular plate-shaped member of the electrostatic chuck 23 on which the wafer W is attracted and held. The heat transfer gas supply holes 28 are connected to a heat transfer gas supply unit (not shown) via a heat transfer gas supply line 29. The heat transfer gas supply unit supplies a heat transfer gas, e.g., helium (He) gas, into a gap between the adsorption surface and the back surface of the wafer W through the heat transfer gas supply holes 28. The helium gas supplied to the gap between the adsorption surface and the back surface of the wafer W efficiently transfers a heat of the wafer W to the electrostatic chuck 23.

A shower head 30 is provided at a ceiling portion of the chamber 11 to face the susceptor 12. The shower head 30 includes an upper electrode 31, a cooling plate 32 that detachably holds the upper electrode 31, and a lid 33 for covering the cooling plate 32. The upper electrode 31 is formed of an electrically conductive circular plate-shaped member having a plurality of gas holes 34 extending therethrough in a thickness direction thereof. Moreover, a buffer chamber 35 is provided inside the cooling plate 32, and a processing gas inlet line 36 is connected to the buffer chamber 35.

In the substrate processing apparatus 10, the processing gas supplied from the processing gas inlet line 36 to the buffer chamber 35 is introduced into the reaction chamber 15 via the gas holes 34, and the introduced processing gas is converted into a plasma by being excited by the high frequency power for plasma generation which is supplied from the second high frequency power supply 20 to the reaction chamber 15 via the susceptor 12. The plasma generated is attracted toward the wafer W by the high frequency power for ion attraction which is supplied from the first high frequency power supply 18 to the susceptor 12, so that the wafer W is subjected to the plasma etching process.

The operation of components of the above-described substrate processing apparatus 10 is controlled based on a program for the plasma etching by a CPU of a control unit (not shown) of the substrate processing apparatus 10.

Figure 2:
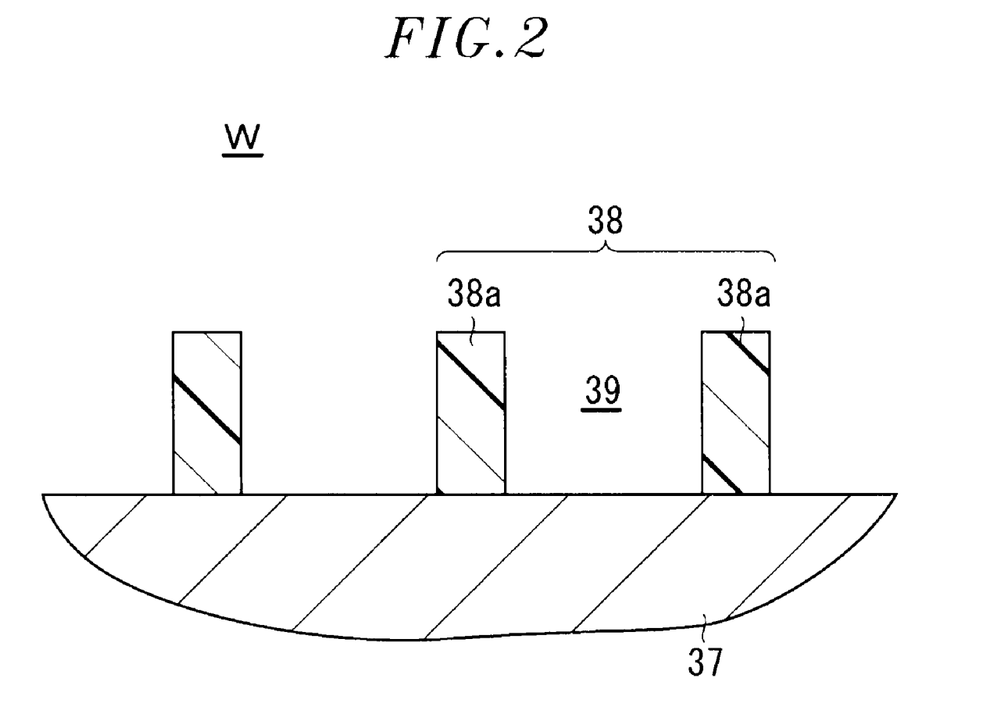
FIG. 2 provides an enlarged cross sectional view depicting a schematic structure of a wafer subjected to the fine pitch line forming process as the substrate processing method in accordance with the first embodiment of the present invention.

FIG. 2 is an enlarged cross sectional view showing a schematic structure of a wafer subjected to a fine pitch line forming process as the substrate processing method in accordance with the embodiment of the present invention.

Referring to FIG. 2, the wafer W includes a photoresist film 38 formed on a processing target film 37. The processing target film 37 is made of, e.g., polysilicon, and the photoresist film 38 is made of, e.g., a positive photosensitive resin. Further, the photoresist film 38 has a plurality of lines (line-shaped portions) 38a formed by lithography and openings 39 exposing the processing target film 37. The width of each of the lines 38a is greater than or equal to about 60 nm immediately after they are formed by lithography. However, the width of each of the lines 38a is reduced to about 30 nm by performing ashing using oxygen radicals or the like.

In this wafer W, a fine pitch line forming process to be described later is performed to form openings 41 having a width substantially equal to that of the lines 38a in the mask film by using the lines 38a having the reduced width of about 30 nm.

FIGS. 3A to 3F show the fine pitch line forming process as the substrate processing method in accordance with the embodiment of the present invention.

Figure 3A:
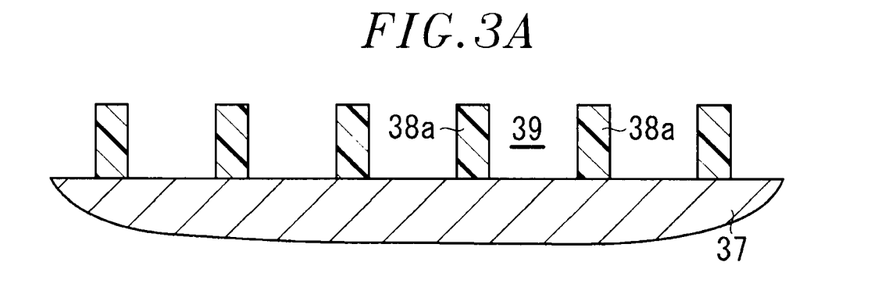
FIGS. 3A to 3F show the fine pitch line forming process as the substrate processing method in accordance with the first embodiment of the present invention.
Figure 3B:
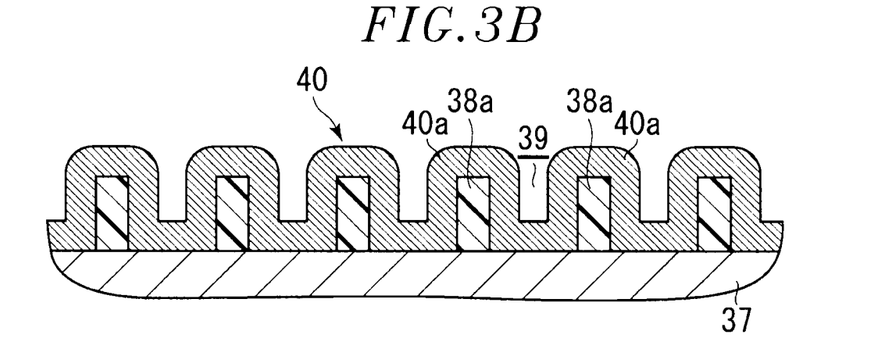

Referring to FIGS. 3A to 3F, first of all, the wafer W is prepared and loaded into a film forming apparatus (not shown) (FIG. 3A) and a silicon oxide film 40 (hard film) is formed on the surface of the wafer W by a CVD. Since the silicon oxide film 40 is isotropically deposited on the lines 38a and the processing target film 37 exposed through the openings 39, the lines 38a grow into thicker lines 40a (FIG. 3B).

Next, the wafer W is unloaded from the film forming apparatus, and then is loaded into the chamber 11 of the plasma processing apparatus 10 to be mounted on the susceptor 12. Thereafter, a processing gas containing $CF_4$ gas is introduced into the reaction chamber 15 through the shower head 30. Further, the high frequency power for plasma generation is applied from the second high frequency power supply 20 to the reaction chamber 15, so that a plasma is generated from the $CF_4$ gas. Moreover, the high frequency power for ion attraction is applied from the first high frequency power supply 18 to the susceptor 12, so that ions in the plasma are attracted to the wafer W. Therefore, the silicon oxide film 40 is removed by etching in a vertical direction in the drawing (anisotropic etching) (first etching step).

Figure 3C:
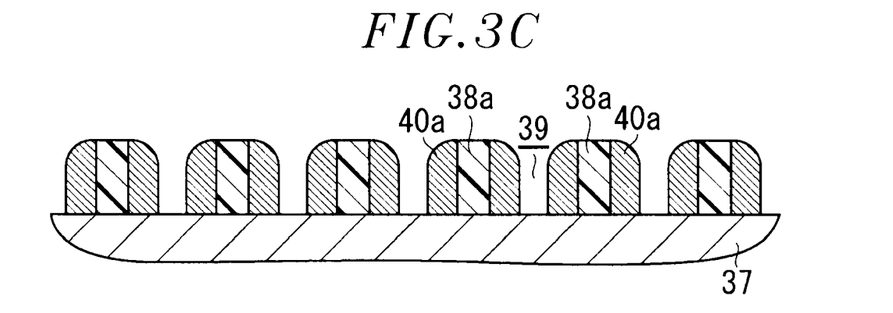

The anisotropic etching is continuously performed until the lines 38a are exposed by removing top portions of the lines 40a and the processing target film 37 is exposed through the openings 39 by removing the silicon oxide film 40 between the lines 40a (FIG. 3C).

Figure 3D:
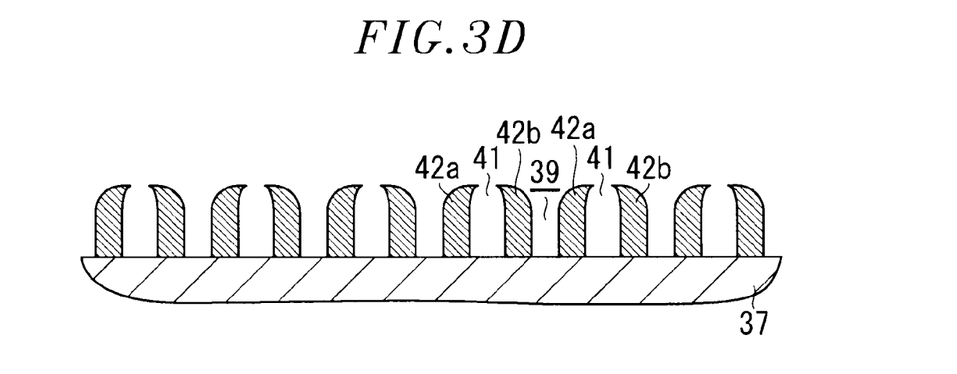
Figure 3E:
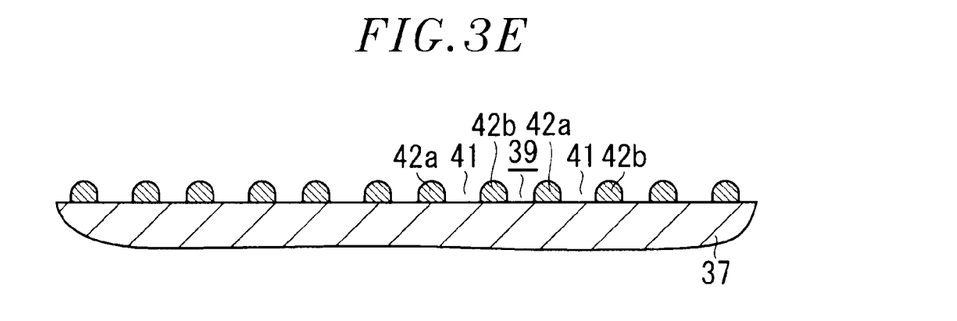

Next, a processing gas containing $O_2$ gas is introduced into the reaction chamber 15 through the shower head 30. Further, the high frequency power for plasma generation is applied to the reaction chamber 15, so that a plasma is generated from the $O_2$ gas. Moreover, the high frequency power for ion attraction is applied to the susceptor 12, so that ions in the plasma are attracted to the wafer W. Hence, spaces 41 are formed by selectively removing the lines 38a exposed in the lines 40a by ashing (ashing step), and the lines 40a become pairs of lines 42a and 42b, wherein each pair of lines 42a and 42b are etched to have a pair of asymmetric sidewalls due to collision of ions with the processing target film 37 in a non-perpendicular direction thereto. To be specific, the pair of sidewalls has an asymmetric shape in which an upper end portion of one line is bent toward the other line (FIG. 3D).

Thereafter, a processing gas containing $CF_4$ gas is introduced into the reaction chamber 15 through the shower head 30. Further, the high frequency power for plasma generation is applied to the reaction chamber 15, so that a plasma is generated from the $CF_4$ gas. Moreover, the high frequency power for ion attraction of, e.g., about 100 W, is applied to the susceptor 12, so that ions in the plasma are attracted to the wafer W. At this time, the heights of the pairs of lines 42a and 42b made of silicon oxide are reduced by performing the etching in a vertical direction in the drawing (second etching step). In general, during a plasma etching, ions tend to concentrate at sharp portions, so that the sharp portions are removed first. Therefore, if the pairs of lines 42a and 42b are etched continuously for a specific time (a predetermined period of time), the bent end portions are removed intensively. Thus, as the pairs of lines 42a and 42b are etched to be symmetrical to each other (FIG. 3E), the heights of the pairs of lines 42a and 42b are reduced.

Figure 4A:
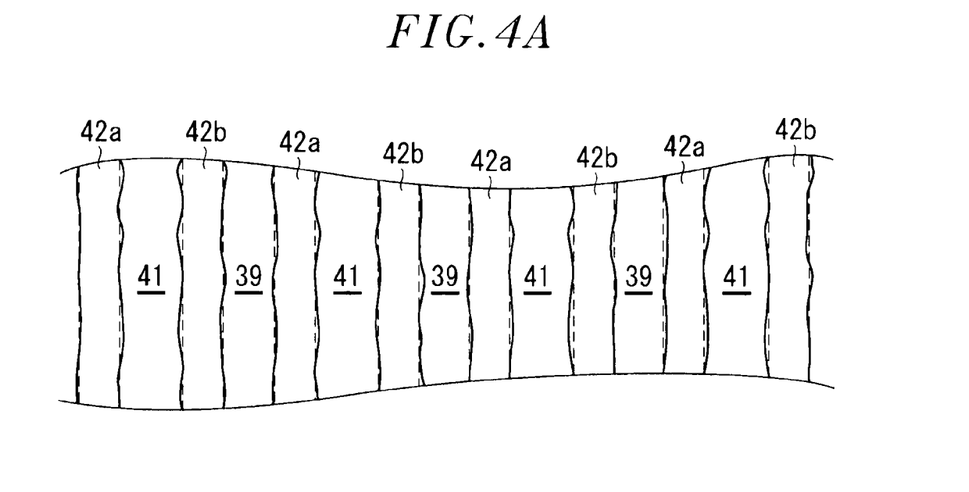
Figure 4B:
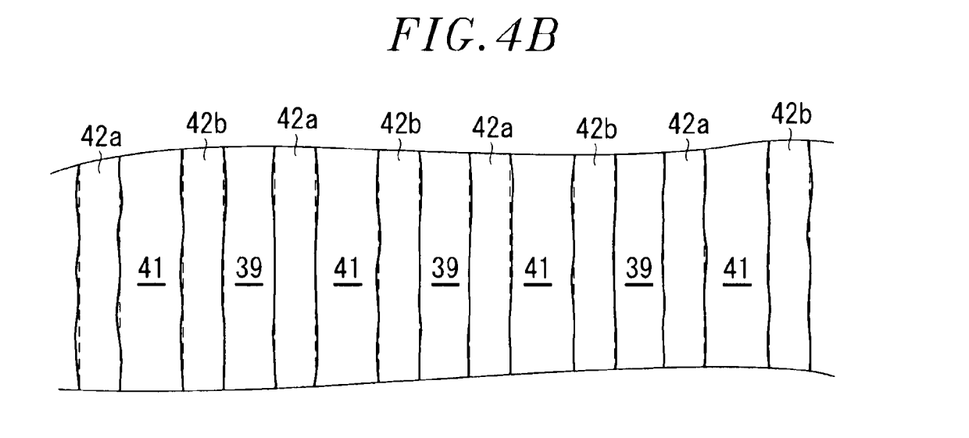

Moreover, when the wafer W is viewed from the top as shown in FIG. 4A, the side portions of the lines 42a and 42b have irregularities instead of a linear shape immediately after the removal of the lines 38a. In other words, the widths of the lines 42a and 42b are not uniform, and so-called LWR (Line Width Roughness) is high. However, the protrusions formed at the side portions of the lines 42a and 42b are removed intensively by performing etching using the plasma of $CF_4$ gas. Accordingly, the LWR can be decreased by smoothening the shapes of the side portions of the lines 42a and 42b (FIG. 4B).

Referring back to FIGS. 3A to 3F, a processing gas containing HBr gas is introduced into the reaction chamber 15 through the shower head 30. Further, the high frequency power for plasma generation is applied to the reaction chamber 15, so that a plasma is generated from the HBr gas. Moreover, the high frequency power for ion attraction is applied to the susceptor 12, so that ions in the plasma are attracted to the wafer W. Therefore, the processing target film 37 that is not covered by the symmetrically etched lines 42a and 42b is etched (third etching step).

Figure 3F:
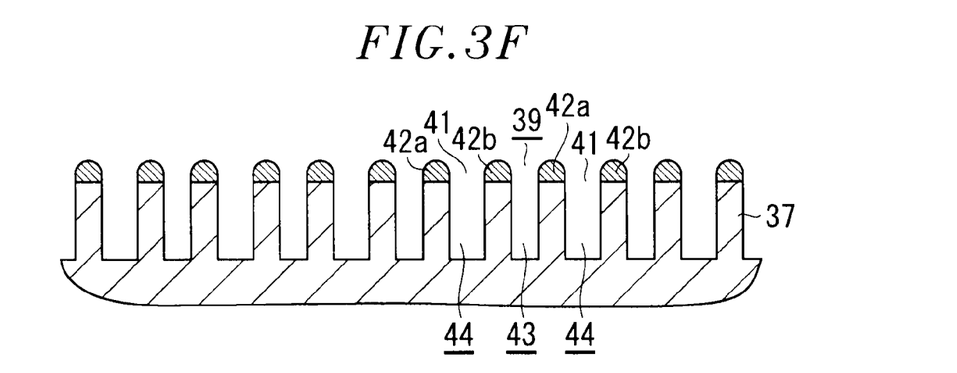

Accordingly, openings 43 corresponding to the openings 39 are formed in the processing target film 37 and, at the same time, an opening 44 corresponding to the gap between the lines 42a and 42b in each pair are formed. Herein, the lines 42a and 42b do not have an asymmetric shape, so that ions introduced into the gap between the lines 42a and 42b in each pair collide with the processing target film 37 in a substantially perpendicular direction thereto without colliding with the bent end portions. As a result, the cross sections of the openings 44 are maintained to have a rectangular shape that is substantially perpendicular to the processing target film 37 without having irregularities (FIG. 3F).

The processes shown in FIGS. 3A to 3F include: exposing the lines 38a by etching the silicon oxide film 40 that covers the lines 38a; selectively removing the exposed lines 38a; and etching the remaining silicon oxide film 40 (the pairs of lines 42a and 42b). Accordingly, the bent end portions of the lines 42a and 42b are removed intensively and, thus, left and right sides of each of the lines 42a and 42b become symmetrical to each other. As a consequence, the openings 44 having a substantially uniform shape can be formed in the processing target film 37 during the etching of the processing target film 37.

In accordance with the processes of FIGS. 3A to 3F, the asymmetric lines 42a and 42b are etched continuously for a predetermined period of time. Accordingly, if the predetermined period of time is set to be longer than or equal to a time period required to remove the bent end portions, each of the lines 42a and 42b can be etched to have left and right sides symmetrical to each other reliably. If the predetermined period of time is set to be shorter than or equal to a time period required to completely remove the lines 42a and 42b, the lines 42a and 42b can be maintained reliably and, thus, the mask film can be prevented from being removed by etching the processing target film 37. In order to decrease the LWR, the predetermined period of time needs to be set longer than or equal to a time period required to remove the protrusions formed at the side portions of the lines 42a and 42b. In other words, the lines 42a and 42b can be formed in a desired shape by setting the predetermined period of time depending on purposes.

In accordance with the processes of FIGS. 3A to 3F, the high frequency power for ion attraction of about 100 W is applied to the susceptor 12 during the etching of the pairs of lines 42a and 42b. However, the applied high frequency power may be smaller than 100 W. Even if a small high frequency power for ion attraction is applied, the line 42a and 42b are not suddenly removed. Therefore, the lines 42a and 42b can be formed in a desired shape by controlling the etching duration time. Further, the lines 42a and 42b can be slightly etched by simply generating a self-bias voltage from the high frequency power for plasma generation without applying the high frequency power for ion attraction to the susceptor 12. For that reason, the high frequency power for ion attraction may be 0 W.

Although the selective removal (ashing) of the lines 38a and the etching of the lines 42a and 42b (silicon oxide film 40) are respectively performed once in the processes shown in FIGS. 3A to 3F, the ashing of the lines 38a and the etching of the lines 42a and 42b may be repeated alternately. In that case, if the asymmetric shape starts to be formed by enlargement of the spaces 41 except for the upper portions thereof during removal of upper portions of the lines 38a in the lines 40a, the ashing is stopped and, thereafter, the lines 42a and 42b are etched. At this time, the bent end portions which start to be formed are removed. Next, the ashing is performed to selectively remove the remaining lines 38a. Accordingly, the growth of the asymmetrical shape by the ashing can be suppressed. Moreover, the repetition number of the ashing and the etching of the lines 42a and 42b are not limited to the above.

Although the silicon oxide film 40 is formed on the wafer W by the CVD in the above example, the silicon oxide film 40 may be formed by an MLD (Molecular Layer Deposition) using oxygen radicals and an silicon-containing gas such as bistertial-butyl-amino-silane (BTBAS) or the like without reducing the widths of the lines 38a of the photoresist film in the wafer W. In that case, C contained in the photoresist film 38 is consumed during the formation of the silicon oxide film 40, so that the widths of the lines 38a are reduced. Accordingly, the formation of the silicon oxide film 40 and the reduction of the widths of the lines 38a can be simultaneously carried out.

Although the silicon oxide film 40 is used as a hard film in the processes shown in FIGS. 3A to 3F, any film capable of ensuring selectivity to the photoresist film 38 and the processing target film 37 may be used as a hard film. For example, an SOG (Spin On Glass) film or an SiC film may be used.

Hereinafter, a substrate processing method in accordance with a second embodiment of the present invention will be described.

The second embodiment has basically the same configuration and operation as those of the first embodiment except that a wafer subjected to a fine pitch line forming process has a silicon oxide film below a photoresist film. Therefore, the description of the same configuration and operation will be omitted, and only differences will be described hereinafter.

Figure 5:
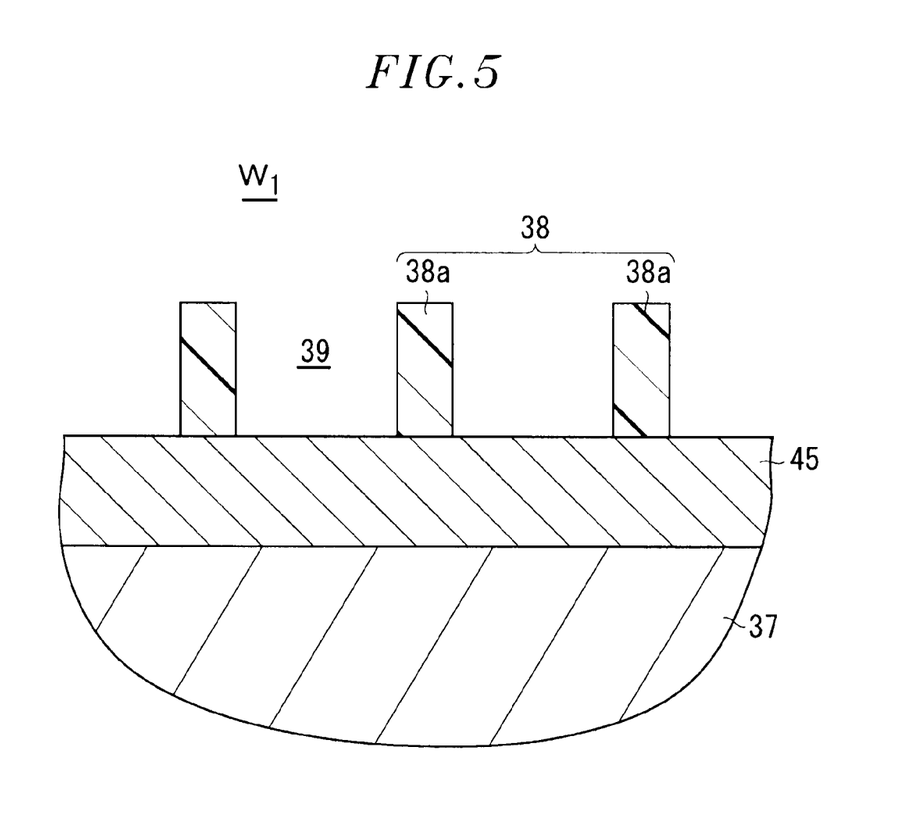
FIG. 5 is an enlarged cross sectional view schematically showing a structure of a wafer subjected to a fine pitch line forming process as a substrate processing method in accordance with a second embodiment of the present invention.

FIG. 5 is an enlarged cross sectional view schematically showing a structure of a wafer subjected to a fine pitch line forming process as the substrate processing method in accordance with the second embodiment of the present invention.

Referring to FIG. 5, a wafer $W_1$ includes a silicon oxide film 45 (first hard film) formed on a processing target film 37; and a photoresist film 38 formed on the silicon oxide film 45. The photoresist film 38 has a plurality of lines 38a having a width of about 30 nm and openings 39 exposing the silicon oxide film 45.

FIGS. 6A to 6F show the fine pitch line forming process as the substrate processing method in accordance with the second embodiment of the present invention.

Figure 6A:
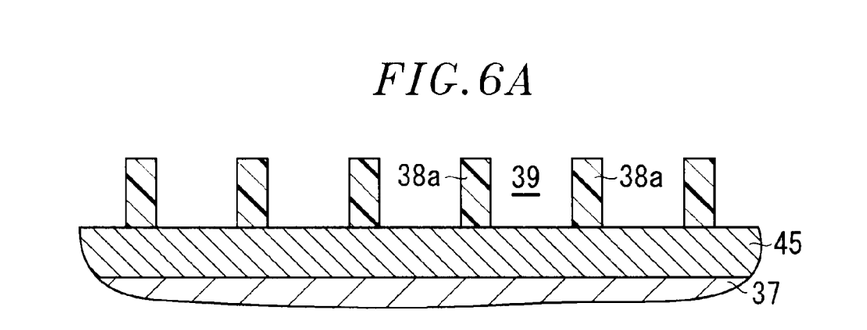
FIGS. 6A to 6F show the fine pitch line forming process as the substrate processing method in accordance with the second embodiment of the present invention.
Figure 6B:
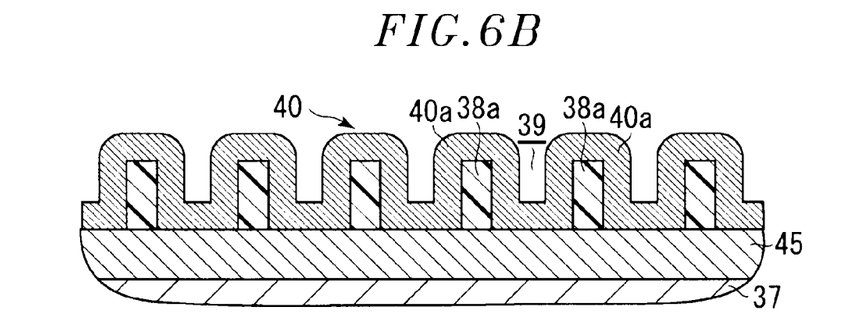
Figure 6C:
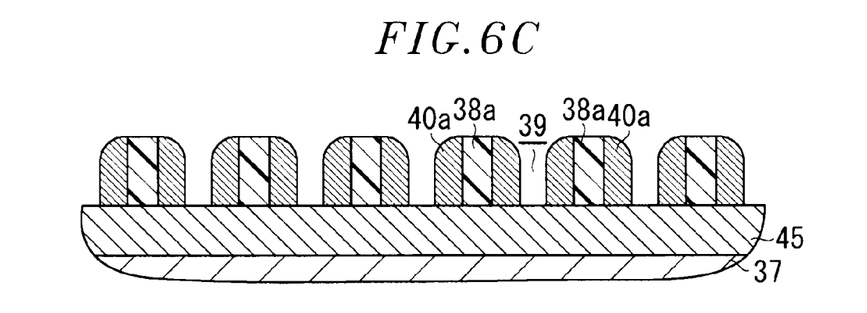

Referring to FIGS. 6A to 6F, the wafer $W_1$ is prepared first (FIG. 6A) and the lines 38a and the silicon oxide film 45 exposed through the openings 39 are coated with the silicon oxide film 40 (second hard film) by the CVD process described in the processes shown in FIGS. 3A to 3F (FIG. 6B). Next, the first etching of the silicon oxide film 40 described in the processes shown in FIGS. 3A to 3F is performed by using the plasma of $CF_4$ gas (first etching step) and, so that the lines 38a are exposed by removing the top portions of the lines 40a and the silicon oxide film 45 is exposed through the openings 39 by removing the silicon oxide film 40 between the lines 40a (FIG. 6C).

Figure 6D:
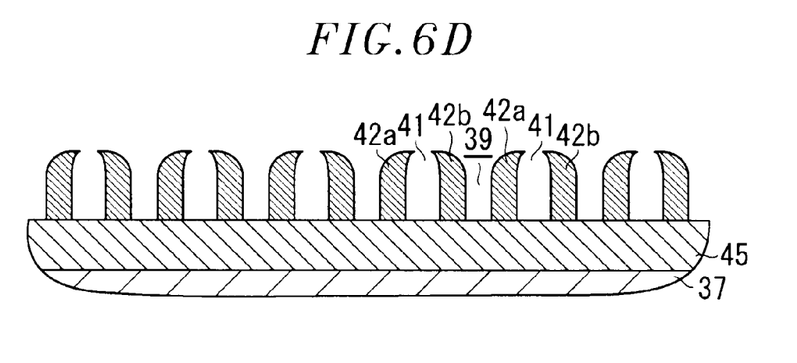

Thereafter, the ashing which is described in the processes shown in FIGS. 3A to 3F is carried out on the exposed lines 38a and, thus, the spaces 41 are formed by selectively removing the lines 38a (ashing step). At this time as well, the pairs of lines 42a and 42b obtained from the line 40a are etched to have an asymmetric shape (FIG. 6D).

Next, the second etching which is described in the processes of FIGS. 3A to 3F is performed on the pairs of lines 42a and 42b (second etching step). At this time, the bent end portions formed by the pairs of lines 42a and 42b are removed intensively and, thus, the left and right sides of each of the lines 42a and 42b are etched to be symmetrical to each other.

The heights of the lines 42a and 42b are reduced by etching. Therefore, if the wafer W subjected to the processes shown in FIGS. 3A to 3F is continuously etched for a long period of time for example, a large amount of the silicon oxide film 40 can be removed. Thus, the width of the lines 42a and 42b may be reduced and the shape of the gap between the lines 42a and 42b in each pair may not be maintained properly. Hence, the lines 42a and 42b may not serve as a mask film during the following etching of the processing target film 37.

Figure 6E:
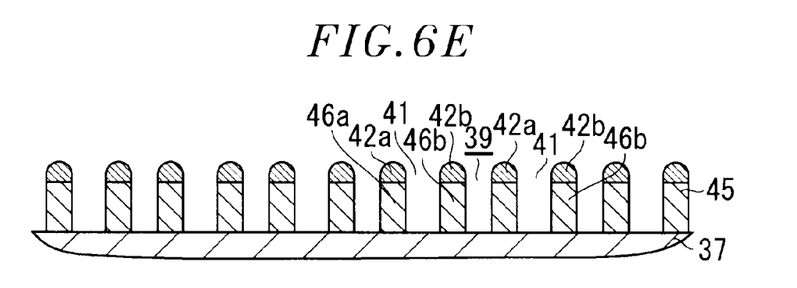

Meanwhile, in the wafer $W_1$, the silicon oxide film 45 is provided below the lines 42a and 42b. Accordingly, during the etching of the lines 42a and 42b, portions of the silicon oxide film 45 exposed through the openings 41 are removed, but portions of the silicon oxide film 45 provided below the lines 42a and 42b are not removed. Thus, the pairs of lines 42a and 42b can be transferred onto the silicon oxide film 45. As a result, it is possible to obtain the pairs of lines 46a and 46b capable of properly maintaining the shape of the gap between the lines in each pair (FIG. 6E).

Figure 6F:
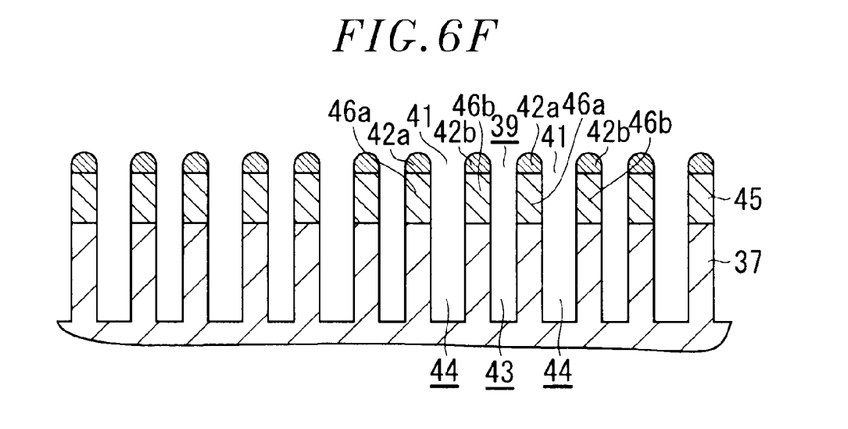

Then, the etching described in the processes shown in FIGS. 3A to 3F is carried out on the processing target film (third etching step). In that case, each of the lines 42a and 42b do not have an asymmetric shape, and the shape of the gap between the lines 46a and 46b in each pair are properly maintained. As a result, the cross sections of the openings 44 in the processing target film 37 are maintained to have a rectangular shape that is substantially perpendicular to the processing target film 37 without having irregularities (FIG. 6F).

The processes shown in FIGS. 6A to 6F includes: exposing the lines 38a by etching the silicon oxide film 40 that covers the lines 38a; exposing the silicon oxide film 45 through the openings 39; selectively removing the exposed lines 38a; etching the remaining Silicon oxide film 40 (the pairs of lines 42a and 42b) and the exposed silicon oxide film 45. Accordingly, the bent end portions of the pairs of lines 42a and 42b are removed intensively and, thus, left and right sides of each of the lines 42a and 42b become substantially symmetrical to each other. Further, each pair of lines 46a and 46b capable of properly maintaining the shape of the gap therebetween is formed below the lines 42a and 42b. As a result, the openings 44 having a substantially uniform shape can be reliably formed in the processing target film 37 during the etching of the processing target film 37.

A substrate subjected to a fine pitch line forming process in the above-described embodiments is not limited to a wafer for semiconductor devices. For example, the substrate may be one of various kinds of a substrate, which can be used in a flat panel display (FPD) or the like including a liquid crystal display (LCD), a photomask, a CD substrate, a print substrate or the like.

The purpose of the present invention can be achieved by providing a system or an apparatus with a storage medium or the like storing program codes of software realizing the functions of the present embodiments and allowing a computer (or a central processing unit (CPU) or a microprocessor unit (MPU)) thereof to read and execute the program codes stored in the medium.

In this case, the program codes themselves read from the medium realize the functions of the aforementioned embodiments and the present invention includes the program codes and the medium storing the program codes.

The medium for providing the program codes may be, e.g., a floppy (registered trademark) disk; a hard disk; an optical disk, e.g., a magneto-optical disk, CD-ROM, CD-R, CD-RW, DVD-ROM, DVD-RAM, DVD-RW, DVD+RW or the like; a magnetic tape; a nonvolatile memory card; ROM; or the like. Alternatively, the program codes may be downloaded from database or a computer (not shown) connected to the Internet, a commercial network, a local area network (LAN) or the like and then supplied to the computer.

The functions of the aforementioned embodiments can be realized by executing the program codes read by the computer. Alternatively, an operating system (OS) or the like operating on the computer can execute a part or the whole of the actual processing in accordance with the instructions of the program codes and the functions of the embodiments can be realized by the processing executed by the OS or the like.

In addition, the program codes can be read from a storage and inputted to a memory in a built-in function extension board or an external function extension unit of a computer and the functions of the embodiments can be realized by the processing of a CPU or the like in the extension board or the extension unit, which executes the extension function thereof according to the instructions of the program codes to perform a part or the whole of the actual processing.

The forms of the program codes may be, e.g., object codes, program codes executed by an interpreter, script data supplied to the OS, or the like.

While the invention has been shown and described with respect to the embodiments, it will be understood by those skilled in the art that various changes and modification may be made without departing from the scope of the invention as defined in the following claims.

What is claimed is:

1. A substrate processing method of processing a substrate including a processing target film, an organic film provided on the processing target film and having a plurality of line-shaped portions having fine width, and a hard film covering the line-shaped portions and the processing target film exposed between the line-shaped portions, the method comprising:
   a first etching step of etching a part of the hard film to expose the organic film and portions of the processing target film between the line-shaped portions;
   an ashing step of selectively removing the exposed organic film without removing the remaining hard film; and
   a second etching step of anisotropically etching a part of the remaining hard film in a vertical direction,
   wherein the processing target film is made of polysilicon.

2. The method of claim 1, further comprising a third etching step for etching the processing target film by using as a mask the hard film remaining after the second etching step.

3. The method of claim 1, wherein the second etching step is continuously performed for a predetermined period of time.

4. The method of claim 1, wherein the substrate is mounted on a mounting table to which a high frequency power for ion attraction is applied, and wherein, in the second etching step, the high frequency power for ion attraction of about 100 W or less is applied to the mounting table.

5. The method of claim 1, wherein the ashing step and the second etching step are repeated.

6. The method of claim 1, wherein the hard film is an oxide film containing silicon.

7. A substrate processing method of processing a substrate including a processing target film, a first hard film formed on the processing target film, an organic film provided on the first hard film and having a plurality of line-shaped portions having fine width, and a second hard film covering the line-shaped portions and the first hard film exposed between the line-shaped portions, the method comprising:

a first etching step of etching a part of the second hard film to expose the organic film and portions of the first hard film between the line-shaped portions;

an ashing step of selectively removing the exposed organic film without removing the remaining second hard film; and a second etching step of anisotropically etching a part of the remaining second hard film and the exposed portions of the first hard film in a vertical direction, wherein the processing target film is made of polysilicon, and wherein the first hard film is made of silicon oxide.

8. The method of claim 7, further comprising a third etching step of etching the processing target film by using as a mask the remaining second hard film and the first hard film remaining after the second etching step.

* * * * *